US009471540B2

(12) United States Patent
Cordero et al.

(10) Patent No.: US 9,471,540 B2
(45) Date of Patent: Oct. 18, 2016

(54) DETECTING TSV DEFECTS IN 3D PACKAGING

(71) Applicant: International Business Machines Corporation, Armonk, NY (US)

(72) Inventors: Edgar R. Cordero, Round Rock, TX (US); Anand Haridass, Bagalore (IN); Girisankar Paulraj, Chennai (IN); Diyanesh B. Vidyapoornachary, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 681 days.

(21) Appl. No.: 13/733,198

(22) Filed: Jan. 3, 2013

(65) Prior Publication Data
US 2014/0188409 A1    Jul. 3, 2014

(51) Int. Cl.
  *G01R 31/26*  (2014.01)
  *G06F 17/00*  (2006.01)
  *H01L 21/66*  (2006.01)
  (Continued)

(52) U.S. Cl.
  CPC ........... *G06F 17/00* (2013.01); *G01R 31/2607* (2013.01); *G01R 31/318513* (2013.01); *H01L 22/34* (2013.01); *H01L 25/0657* (2013.01); *H01L 2225/06541* (2013.01); *H01L 2924/0002* (2013.01)

(58) Field of Classification Search
  CPC .............. G01R 31/26; G01R 31/2607; G01R 31/318513; G01R 31/2803; G01R 31/28; G01R 31/318342; G01R 31/31835; G01R 31/318357; G01R 31/318378; H01L 22/34; H01L 2225/06541; H01L 2225/06544; H01L 22/10; H01L 23/522; H01L 23/5227; H01L 25/0657; G06F 17/00
  USPC ........................................................ 702/58
  See application file for complete search history.

(56) References Cited

U.S. PATENT DOCUMENTS 7,977,962 B2  7/2011  Hargan et al.
8,154,309 B2  4/2012  Agarwal et al.
8,219,340 B2  7/2012  Su et al.
(Continued)

FOREIGN PATENT DOCUMENTS

EP      2541415 A1     1/2013
WO   WO2014107563 A1  7/2014

OTHER PUBLICATIONS

PCT Search Report, dated May 26, 2014, received in PCT/US2014/010157, 38 pages.

(Continued)

*Primary Examiner* — John Breene
*Assistant Examiner* — Lynda Dinh
(74) *Attorney, Agent, or Firm* — Steven Meyers; Erik K. Johnson

(57) ABSTRACT

A computer determines a threshold signal voltage of a semiconductor device. The computer determines a first expected signal propagation time for a signal travelling through a first test path of the semiconductor device. The computer transmits a first signal through the first test path. The computer measures a signal voltage and signal propagation time of the first signal. The computer determines that the signal voltage of the first signal does not reach or exceed the threshold signal voltage within the first expected signal propagation time. The computer determines that the first test path contains a defect.

19 Claims, 7 Drawing Sheets

(51) Int. Cl.
  *G01R 31/3185*  (2006.01)
  *H01L 25/065*  (2006.01)

(56) References Cited

U.S. PATENT DOCUMENTS

| | | | |
|---|---|---|---|
| 8,384,430 B2 * | 2/2013 | Tseng et al. | 326/52 |
| 2006/0044001 A1 | 3/2006 | Cano et al. | |
| 2010/0060310 A1 | 3/2010 | Laisne et al. | |
| 2010/0153043 A1 | 6/2010 | Su et al. | |
| 2010/0295600 A1 * | 11/2010 | Kim et al. | 327/365 |
| 2011/0080185 A1 | 4/2011 | Wu et al. | |
| 2011/0102006 A1 | 5/2011 | Choi et al. | |
| 2011/0175639 A1 | 7/2011 | Yoko et al. | |
| 2011/0267092 A1 | 11/2011 | Hargan et al. | |
| 2011/0309359 A1 | 12/2011 | Saen et al. | |
| 2011/0316572 A1 | 12/2011 | Rahman | |
| 2012/0025846 A1 | 2/2012 | Minas et al. | |
| 2012/0097944 A1 | 4/2012 | Lin et al. | |
| 2012/0104388 A1 | 5/2012 | Choi et al. | |
| 2012/0138927 A1 | 6/2012 | Kang | |
| 2012/0286814 A1 | 11/2012 | Wang et al. | |

OTHER PUBLICATIONS

Van Der Plas et al., "Design Issues and Considerations for Low-Cost 3-D TSV IC Technology," IEEE Journal of Solid-State Circuits, vol. 46, No. 1, Jan. 2011, pp. 293-307.

Cho et al., "Design Method and Test Structure to Characterize and Repair TSV Defect Induced Signal Degradation in 3D System," Computer-Aided Design (ICCAD), 2010 IEEE/ACM International Conference, Nov. 7-11, 2010, San Jose, CA, DOI: 10.1109/ICCAD. 2010.5654255, pp. 694-697.

* cited by examiner

| PATH COVERAGE | DEFECT DETECTION | RESULT |
|---|---|---|
| 110/112 | 114/112 | 110/112/114 | DEFECT FOUND |
| 110/116 | 114/116 | 110/114/116 | |
| 110/120 | 114/120 | 110/114/120 | |
| 114/112 | 118/112 | 112/114/118 | DEFECT FOUND |
| 114/116 | 118/116 | 114/116/118 | |
| 114/120 | 118/120 | 114/118/120 | |
| 118/112 | 110/112 | 110/112/118 | |
| 118/116 | 110/116 | 110/116/118 | |
| 118/120 | 110/120 | 110/118/120 | |

FIG. 5

DETECTING TSV DEFECTS IN 3D PACKAGING

FIELD OF THE INVENTION

The present invention relates generally to semiconductor fabrication, and more particularly to detecting TSV defects in 3D integrated circuits.

BACKGROUND

The Through Silicon Vias (TSVs) in a 3D stack are the channels for transferring signals between different tiers in a 3D stack. The functionality of a 3D integrated circuit strongly depends on the fidelity of signals through TSVs. Defects can be created in the TSV process while forming the TSVs before bonding (assuming a via-first process) or while bonding different dies together. Specifically, TSVs are susceptible to short defects. A short during TSV formation creates a resistive defect through the oxide. Since the substrate surrounding the TSVs is strongly connected to ground, this results in a low resistive path between the TSV and ground. Such shorts in the TSV will result in partial or complete degradation of signal quality. When the TSV is driven by a driver, the signal swing and/or slew at the receiver end can vary significantly resulting in either complete or partial signal degradation. Therefore, maintaining the signal fidelity through TSVs, especially on critical interfaces such as high speed serial links which establish communication in a system on a chip, is a primary challenge in 3D system integration. TSV technology drives the integration of chips in 3D packaging and overall integrated circuit reliability depends on TSVs and therefore it is important for TSVs to be free from defects.

SUMMARY

Embodiments of the present invention provide a system and method for detecting defects in through silicon vias (TSVs) of a semiconductor device. A computer determines a threshold signal voltage of a semiconductor device. The computer determines a first expected signal propagation time for a signal travelling through a first test path of the semiconductor device. The computer transmits a first signal through the first test path. The computer measures a signal voltage and signal propagation time of the first signal. The computer determines that the signal voltage of the first signal does not reach or exceed the threshold signal voltage within the first expected signal propagation time. The computer determines that the first test path contains a defect.

A computer determines a threshold signal voltage of a semiconductor device. The computer determines a first expected signal propagation time for a signal travelling through a first test path of the semiconductor device. The computer transmits a first signal through the first test path at time one. The computer determines a signal voltage and signal propagation time of the first signal. The computer determines that the signal voltage of the first signal reaches or exceeds the threshold signal voltage within the first expected signal propagation time. The computer determines that the first test path does not contain a defect at time one.

A semiconductor device for detecting defects in through silicon vias (TSVs), including a plurality of semiconductor dies connected by at least one transmit TSV and at least one receive TSV, wherein at least one of the plurality of semiconductor dies includes: (i) one or more multiplexers for looping a signal from the at least one transmit TSV to the at least one receive TSV; (ii) one or more edge detectors for measuring signal voltage; (iii) one or more delay monitors for measuring signal propagation time; and (iv) one or more test engines, wherein the one or more test engines coordinate(s) all operations of the one or more multiplexers, edge detectors, and delay monitors, and determine(s) if a signal voltage of a signal reaches or exceeds a threshold signal voltage.

BRIEF DESCRIPTION OF THE SEVERAL VIEWS OF THE DRAWINGS

FIG. 5 depicts a table summarizing the path coverage and defects detecting for each test path, in accordance with an embodiment of the invention.

DETAILED DESCRIPTION

Figure 1:
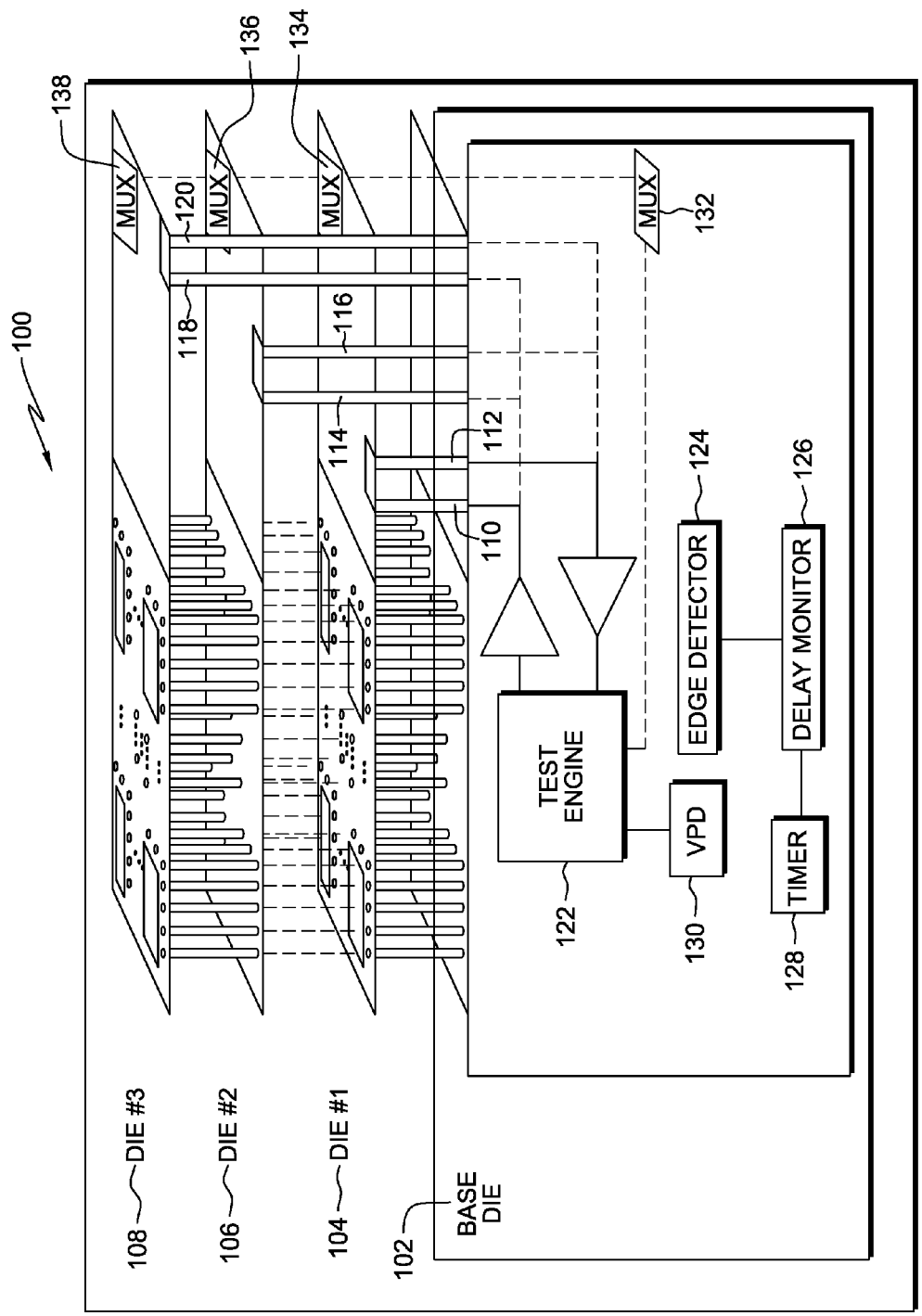
FIG. 1 depicts a semiconductor device, in accordance with an embodiment of the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code/instructions embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Embodiments of the present invention will now be described in detail with reference to the accompanying Figures.

FIG. 1 depicts semiconductor device 100, in accordance with an exemplary embodiment of the invention. In the exemplary embodiment, semiconductor device 100 contains a base semiconductor die, base die 102, and three other semiconductor dies, die 104, die 106 and die 108, that connect to base die 102 via through silicon vias (TSVs). Base die 102 connects with die 104 via transmit TSV 110 and receive TSV 112; base die 102 connects with die 104 and die 106 via transmit TSV 114 and receive TSV 116; and base die 102 connects with die 104, die 106 and die 108 via transmit TSV 118 and receive TSV 120.

Die 104 contains multiplexer 134. In the exemplary embodiment, multiplexer 134 is a hardware device that receives a signal from base die 102 via a transmit TSV, such as transmit TSV 110. Multiplexer 134 then transmits the signal back to base die 102 via a receive TSV, such as receive TSV 112. In the exemplary embodiment, the signal passes through a buffer before entering and after exiting each TSV. In the exemplary embodiment, multiplexer 134 is a 3 to 1 hardware device, meaning multiplexer 134 is capable of transmitting a received signal to one of three different receive TSVs. Therefore, multiplexer 134 would be able to connect to all three receive TSVs depicted in FIG. 1, i.e., receive TSV 112, receive TSV 116, and receive TSV 120. In other embodiments, multiplexer 134 can be a 2 to 1 hardware device or a 1 to 1 hardware, meaning multiplexer 134 would represent a plurality of multiplexers located on die 104.

Die 106 contains multiplexer 136. In the exemplary embodiment, multiplexer 136 is a hardware device that receives a signal from base die 102 via a transmit TSV, such as transmit TSV 114. Multiplexer 136 then transmits the signal back to base die 102 via a receive TSV, such as receive TSV 116. In the exemplary embodiment, the signal passes through a buffer before entering and after exiting each TSV. In the exemplary embodiment, multiplexer 136 is a 3 to 1 hardware device, however, in other embodiments, multiplexer 136 can be a 2 to 1 hardware device or a 1 to 1 hardware, meaning multiplexer 136 would represent a plurality of multiplexers located on die 106.

Die 108 contains multiplexer 138. In the exemplary embodiment, multiplexer 138 is a hardware device that receives a signal from base die 102 via a transmit TSV, such as transmit TSV 118. Once the signal is received, multiplexer 138 then transmits the signal back to base die 102 via a receive TSV, such as receive TSV 120. In the exemplary embodiment, the signal passes through a buffer before entering and after exiting each TSV. In the exemplary embodiment, multiplexer 138 is a 3 to 1 hardware device, however, in other embodiments, multiplexer 138 can be a 2 to 1 hardware device or a 1 to 1 hardware device, meaning multiplexer 138 would represent a plurality of multiplexers located on die 108.

Base die 102 contains test engine 122, edge detector 124, delay monitor 126, timer 128, VPD 130, and multiplexer 132. In the exemplary embodiment, test engine 122 is a hardware device that coordinates all operations of transmitting and receiving signal between semiconductor dies, measuring signal voltage and measuring signal propagation time. Multiplexer 132 is a hardware device that receives a signal from test engine 122 and transmits the signal to the appropriate transmit TSV. In the exemplary embodiment, multiplexer 132 is a 3 to 1 hardware device, meaning that multiplexer 132 is capable of transmitting a received signal to one of three different transmit TSVs. Therefore, multiplexer 132 would be able to connect to all three transmit TSVs depicted in FIG. 1, i.e., transmit TSV 110, transmit TSV 114, and transmit TSV 118. In other embodiments, multiplexer 132 can be a 2 to 1 hardware device or a 1 to 1 hardware, meaning multiplexer 132 would represent a plurality of multiplexers located on base die 102.

Edge detector 124 is a hardware device that measures the signal voltage of signals travelling through a test path. In the exemplary embodiment, edge detector 124 detects when the signal voltage of a signal reaches a pre-determined threshold voltage. Delay monitor 126 is a hardware device that measures the signal propagation time of a signal travelling through semiconductor device 100. Delay monitor 126 uses timer 128, which in the exemplary embodiment, is also a hardware device, to determine the signal propagation time of a signal which is transmitted from base die 102 to one or more of the other semiconductor dies. In the exemplary embodiment, delay monitor 126 starts timer 128 when a signal is transmitted from test engine 122 to a transmit TSV, and stops timer 128 when the signal is received by test engine 122 from a receive TSV. For example, for a signal travelling from the base die to die 104, delay monitor 126 starts timer 128 when the signal is transmitted from test engine 122 to transmit TSV 110 via multiplexer 132, and stops timer 128 when the signal is received by test engine 122 from receive TSV 112. Delay monitor 126 determines the signal propagation time of the signal from the start and stop time information of timer 128.

VPD 130 (vital product data) is a memory device that, in the exemplary embodiment, stores simulation information, such as a threshold voltage and an expected signal propagation time for each test path. In addition, VPD 130 can also store other information such as defective test paths identified by test engine 122.

Test engine 122 is a hardware device that determines if a signal voltage reaches or exceeds a pre-determined threshold voltage within an expected signal propagation time determined for the test path. In the exemplary embodiment, test engine 122 coordinates the operations of edge detector 124, delay monitor 124, multiplexer 132, multiplexer 134, multiplexer 136 and multiplexer 138. In the exemplary embodiment, test engine 122 receives the measured signal voltage of a signal travelling through a test path from edge detector 124 and the signal propagation time from delay monitor 124. Test engine 122 compares this information to the simulation data contained in VPD 130 to determine if a defect exists in the test path. The operations of test engine 122 are explained in more detail with regard to FIGS. 2 through 8.

Figure 2:
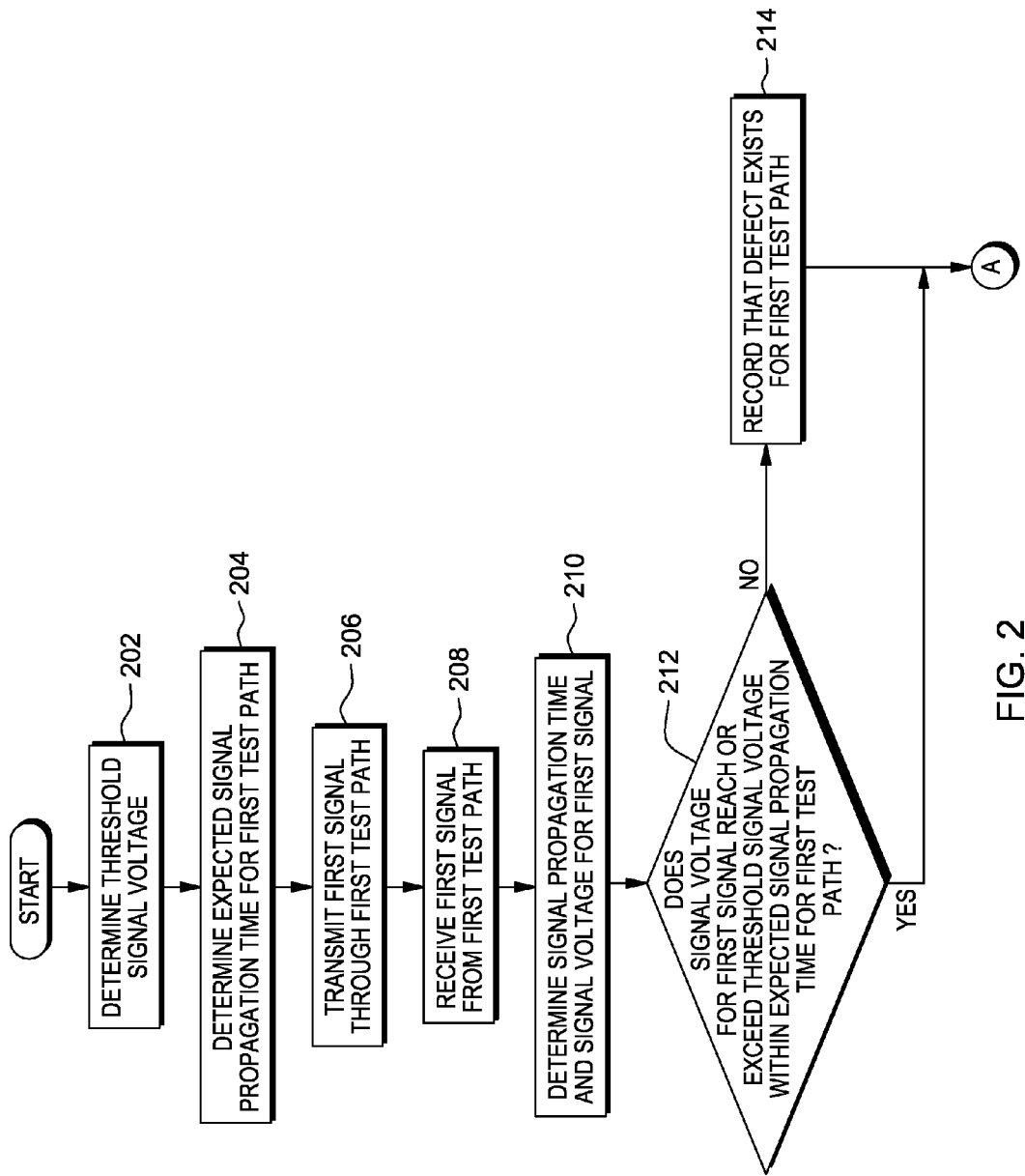
FIGS. 2 and 3 are a flowchart that illustrates a process for detecting TSV defects in a semiconductor device prior to deployment, in accordance with an embodiment of the invention.
Figure 3:
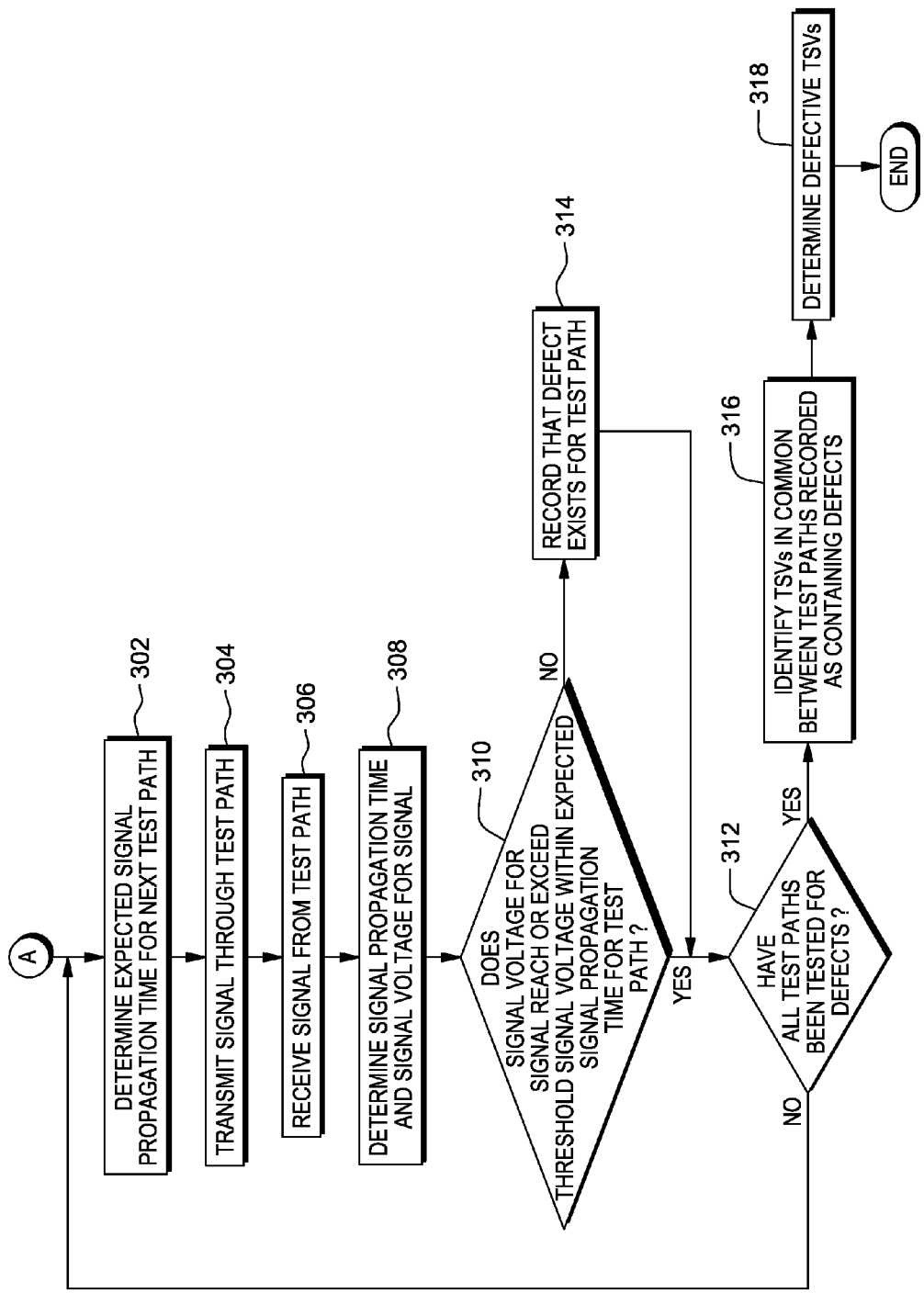

FIGS. 2 and 3 are a flowchart that illustrates a process for detecting TSV defects in a semiconductor device prior to deployment, in accordance with an embodiment of the invention. In the exemplary embodiment, test engine 122 determines a threshold signal voltage by analyzing simulation data for semiconductor device 100 (step 202). Test engine 122 then determines an expected signal propagation time for a first test path by analyzing simulation data for semiconductor device 100 (step 204). Unlike, the threshold signal voltage, the expected signal propagation time can change depending on the test path chosen, due to the fact that some test paths may be longer or shorter than others. Therefore, test engine 122 determines a separate expected signal propagation time for each test path chosen.

Test engine 122 then transmits a first signal through the first test path (step 206). For example, for a test path travelling from base die 102 to die 104 and back, the first signal is transmitted through multiplexer 132, which sends the first signal to a transmit buffer. The first signal is then sent to transmit TSV 110 and passes through a receive buffer before being received by multiplexer 134 located on die 104. Multiplexer 134 then sends the first signal to receive TSV 112 via a transmit buffer. Test engine 122 then receives the first signal via a receive buffer (step 208).

Test engine 122 then coordinates with edge detector 124, delay monitor 126, and timer 128 to determine the signal propagation time and signal voltage of the first signal (step 210). In the exemplary embodiment, edge detector 124 measures the signal voltage of the first signal as it travels through the first test path. Delay monitor 126 measures the signal propagation time by starting timer 128 when the first signal is transmitted by test engine 122 and stops timer 128 when the first signal is received by test engine 122. Test engine 122 then receives the determined signal voltage and signal propagation time of the first signal from edge detector 124 and delay monitor 126.

Test engine 122 then determines if the signal voltage of the first signal reaches or exceeds the threshold voltage within the expected signal propagation time for the first test path determined from simulation data (decision 212). In the exemplary embodiment, test engine 122 includes an error threshold value in this determination. For example, if the signal voltage of the first signal reaches a signal voltage that is less than 0.5% under the threshold voltage level, test engine 122 considers the first signal as reaching the threshold voltage. In other embodiments, other error threshold values can be used. If test engine 122 determines that the signal voltage of the first signal reaches or exceeds the threshold voltage within the expected signal propagation time for the first test path (decision 212, "YES" branch), test engine 122 moves on to the next test path and determines an expected signal propagation time for the next test path using simulation data (step 302). If test engine 122 determines that the signal voltage of the first signal does not reach or exceed the threshold voltage within the expected signal propagation time for the first test path (decision 212, "NO" branch), test engine 122 records that a defect exists for the first test path (step 214). Test engine 122 then moves on to the next test path and determines an expected signal propagation time for the next test path using simulation data (step 302).

Once test engine 122 determines an expected signal propagation time for the next test path (step 302), test engine 122 transmits a signal through the test path (step 304). In the exemplary embodiment, with regard to FIG. 1, the next test path can be from base die 102 to die 104 and back using receive TSV 116 in place of receive TSV 112. For this test path, test engine 122 transmits the signal to transmit TSV 110 via multiplexer 132 and a transmit buffer. The signal is then received by multiplexer 134, located on die 104, via a receive buffer and then relayed to receive TSV 116 via a transmit buffer. The signal reaches base die 102 and passes through a receive buffer before test engine 122 receives the signal (step 306).

Test engine 122 then coordinates with edge detector 124, delay monitor 126, and timer 128 to determine the signal propagation time and signal voltage of the signal transmitted through the test path (step 308). In the exemplary embodiment, edge detector 124 measures the signal voltage of the signal as it travels through the test path. Delay monitor 126 measures the signal propagation time by starting timer 128 when the signal is transmitted by test engine 122 and stops timer 128 when the signal is received by test engine 122. Test engine 122 then receives the determined signal voltage and signal propagation time of the signal from edge detector 124 and delay monitor 126.

Test engine 122 then determines if the signal voltage of the signal reaches or exceeds the threshold voltage within the expected signal propagation time for the test path determined from simulation data (decision 310). As stated above, in the exemplary embodiment, test engine 122 includes an error threshold value in this determination. If test engine 122 determines that the signal voltage of the signal reaches or exceeds the threshold voltage within the expected signal propagation time for the test path (decision 310, "YES" branch), test engine 122 determines if all test paths of semiconductor device 100 have been tested for defects (decision 312). If test engine 122 determines that the signal voltage of the signal does not reach or exceed the threshold voltage within the expected signal propagation time for the test path (decision 310, "NO" branch), test engine 122 records that a defect exists in the test path (step 314). Test engine then determines if all test paths of semiconductor device 100 have been tested for defects (decision 312).

If test engine 122 determines all test paths of semiconductor device 100 have been tested for defects (decision 312, "YES" branch), test engine 122 identifies the TSVs in common between test paths recorded as containing defects (step 316). Test engine 122 then determines the defective TSVs from the identified TSVs in common (step 318). For example, if test engine 122 determines that the two exemplary test paths detailed above both contain a defect, test engine 122 identifies the TSVs in common, i.e., transmit TSV 110. Test engine 122 then determines that the defect lies in TSV 110 by way of logical deduction. If test engine 122 determines that all test paths of semiconductor 100 have not been tested for defects (decision 312, "NO" branch), test engine returns to step 302 and determines if a next test path contains a defect.

Figure 4:
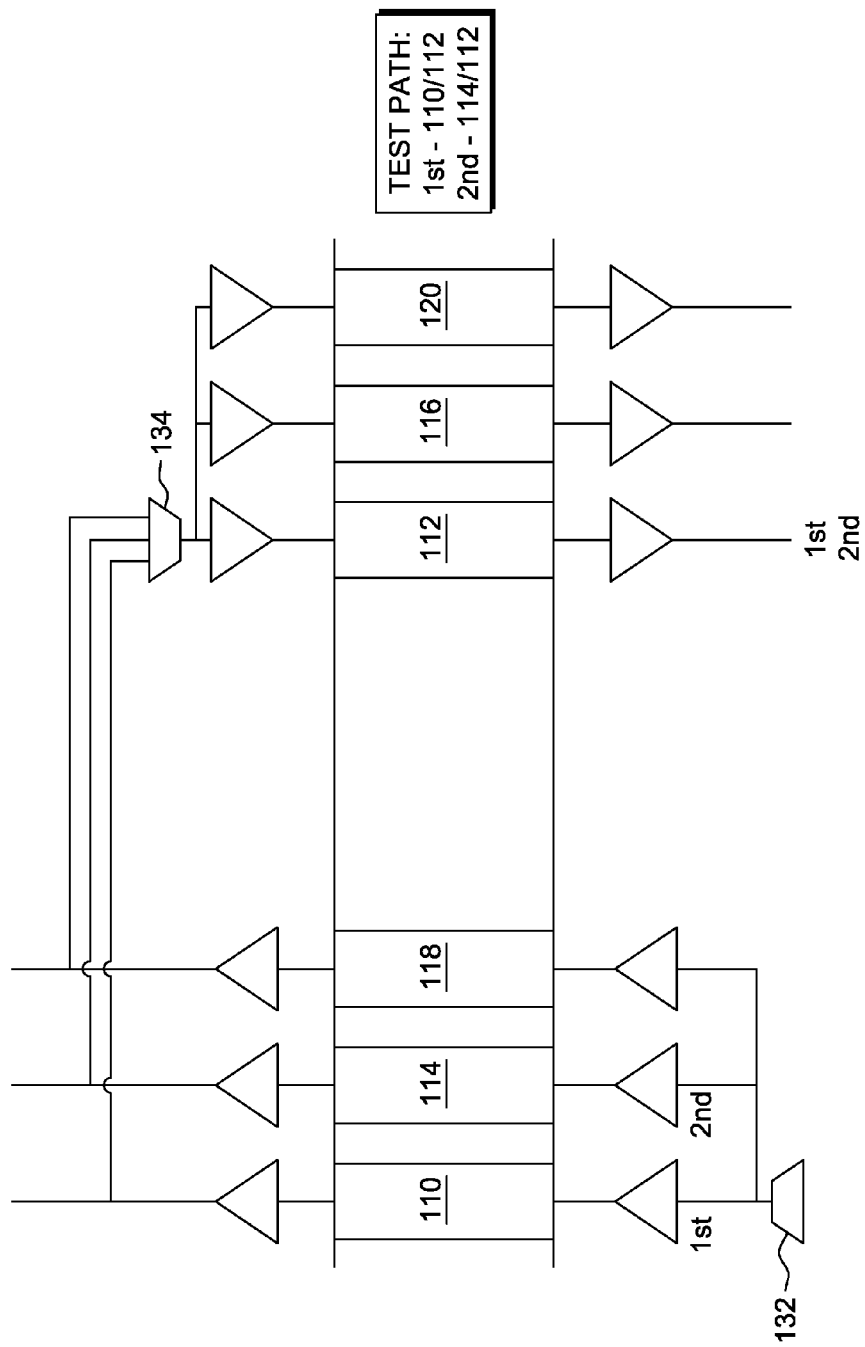
FIG. 4 depicts a first and a second signal travelling through a first and a second test path, respectively, in accordance with an embodiment of the invention.

FIG. 4 (with respect to FIG. 1) depicts a first and a second signal travelling from base die 102 to die 104 via a first and a second test path, respectively, in accordance with an exemplary embodiment of the invention. In the exemplary embodiment, test engine 122 receives information regarding the test path to be tested. Test engine 122 then transmits this information to the appropriate multiplexers in semiconductor device 100. For the first test path depicted in FIG. 4, test engine 122 transmits the first signal to multiplexer 132, which then transmits the first signal onward to transmit TSV 110 via a transmit buffer. In the exemplary embodiment, when the first signal is transmitted by test engine 122, delay monitor starts timer 128 and edge detector 124 monitors the signal voltage of the first signal. The first signal is received by multiplexer 134 located on die 104 via a receive buffer. Multiplexer 134 then transmits the first signal through receive TSV 112 via a transmit buffer. The first signal is then received by test engine 122 via a receive buffer. When the first signal is received by test engine 122, delay monitor 126 stops timer 128. Delay monitor 126 then sends the propagation time information and edge detector 124 sends the signal voltage information of the first signal to test engine 122. Test engine 122 compares this information to the simulation data to determine if a defect exists in the first test path. Test engine 122 then records all the information in VPD 130. The same steps are repeated for each test path.

FIG. 5 depicts a table summarizing the path coverage and defects detected for each test path, in accordance with an exemplary embodiment of the invention. This figure illustrates the manner in which test engine 122 analyzes the test paths to determine which TSVs contain defects. In the exemplary embodiment, test engine 122 determines the TSVs in common between test paths that contain defects. For example, FIG. 5 illustrates that test path 110/112 and test path 114/112 contain defects. By way of logical deduction, test engine 122 determines that a defect lies in TSV 112. This process is repeated for all test paths that are determined to contain defects. In addition, each die is examined separately.

For example, if a defect is found in test paths 114/116 and 114/120 for a signal travelling from base die 102 to die 106, test engine 122 determines that a defect lies in TSV 114. However, the defect may not show up for a signal travelling from base die 102 to die 104 via the same test path. This may be due to the defect existing in the upper portion of TSV 114 above die 104. Testing all possible test paths for a signal travelling from base die 102 to each of the dies (die 104, die 106 and die 108) allows these types of defects to be detected.

Figure 6:
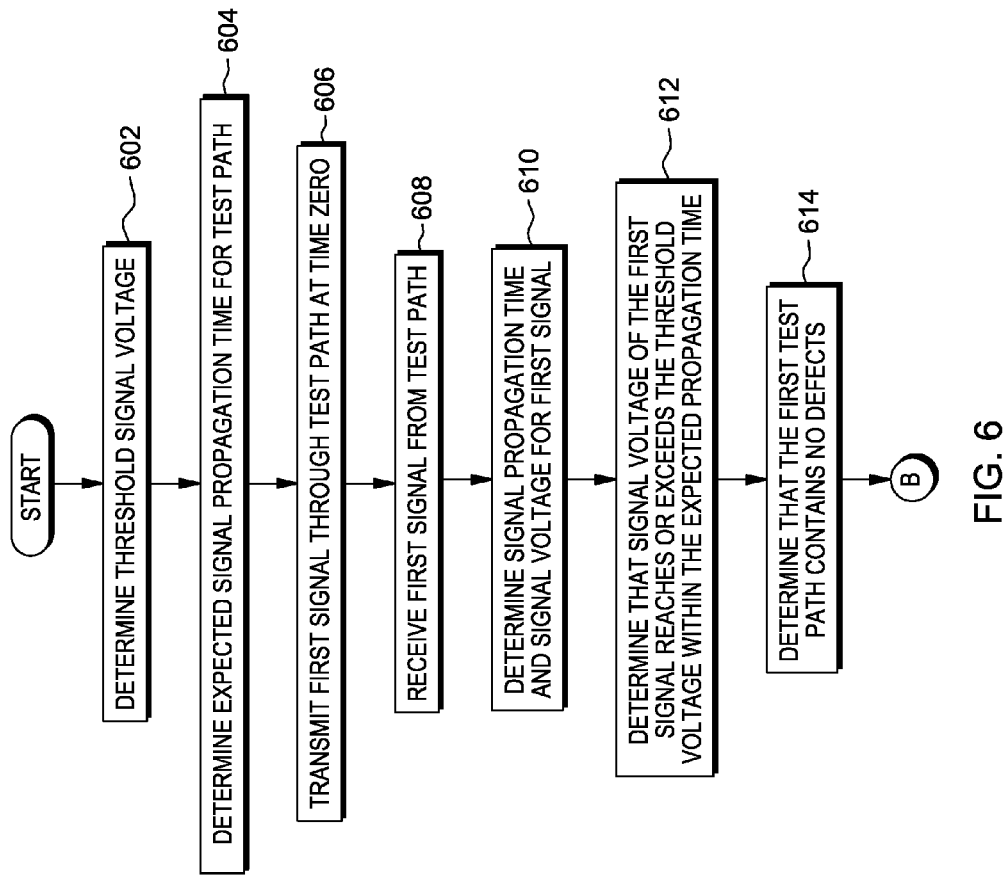
FIGS. 6 and 7 are a flowchart that illustrates a process for detecting TSV defects in a semiconductor device that has been deployed, in accordance with an embodiment of the invention.
Figure 7:
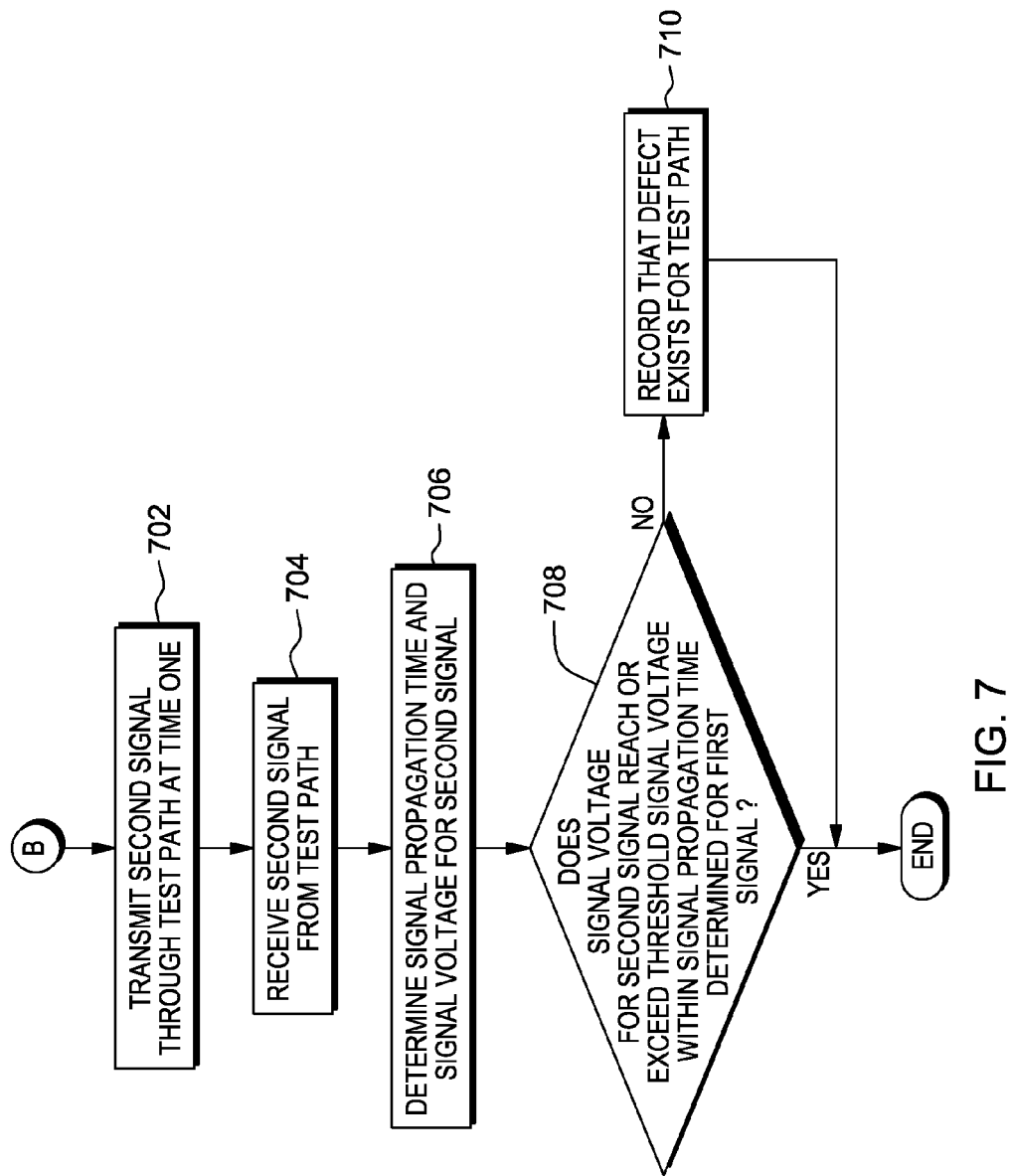

FIGS. 6 and 7 are a flowchart that illustrates a process for detecting TSV defects in a semiconductor device that has been deployed, in accordance with an exemplary embodiment of the invention. In the exemplary embodiment, test engine 122 determines a threshold signal voltage for a test path by analyzing simulation data for semiconductor device 100 (step 602). Test engine 122 then determines an expected signal propagation time for the test path by analyzing simulation data for semiconductor device 100 (step 604). As stated above, the expected signal propagation time can change depending on the test path chosen, due to the fact that some test paths maybe longer or shorter than others. Therefore, test engine 122 determines an expected signal propagation time for each test path that is examined.

Test engine 122 then transmits a first signal through the test path at time zero (step 606). In the exemplary embodiment, time zero is a period of time before semiconductor device 100 is deployed/certified for use, such as the testing phase of semiconductor device 100. In other embodiments, time zero can be a period of time after semiconductor device 100 has been deployed/certified for use. Test engine 122 then receives the first signal via a receive buffer after it has travelled through the test path (step 608).

Test engine 122 then coordinates with edge detector 124, delay monitor 126, and timer 128 to determine the signal propagation time and signal voltage of the first signal (step 610). In the exemplary embodiment, edge detector 124 measures the signal voltage of the first signal as it travels through the test path. Delay monitor 126 measures the signal propagation time by starting timer 128 when the first signal is transmitted by test engine 122 and stops timer 128 when the first signal is received by test engine 122. Test engine 122 then receives the determined signal voltage and signal propagation time of the first signal from edge detector 124 and delay monitor 126.

Test engine 122 then determines that the signal voltage of the first signal reaches or exceeds the threshold voltage within the expected signal propagation time for the first test path determined from simulation data (step 612). Based on this determination, test engine 122 determines that the test path contains no defects at time zero (step 614).

Once test engine 122 determines that the test path contains no defects at time zero (step 614), test engine 122 transmits a second signal through the test path at time one (step 702). In the exemplary embodiment, time one is a period of time after time zero, when semiconductor device 100 is deployed/certified for use or ready to be utilized. Test engine 122 then receives the second signal via a receive buffer after it has travelled through the test path (step 704).

Test engine 122 then coordinates with edge detector 124, delay monitor 126, and timer 128 to determine the signal propagation time and signal voltage of the second signal transmitted through the test path (step 706). In the exemplary embodiment, edge detector 124 measures the signal voltage of the second signal as it travels through the test path. Delay monitor 126 measures the signal propagation time by starting timer 128 when the signal is transmitted by test engine 122 and stopping timer 128 when the signal is received by test engine 122. Test engine 122 then receives the determined signal voltage and signal propagation time of the signal from edge detector 124 and delay monitor 126.

Test engine 122 then determines if the signal voltage of the second signal reaches or exceeds the threshold voltage within the signal propagation time of the first signal for the test path (decision 708). As stated above, in the exemplary embodiment, test engine 122 includes an error threshold value in this determination. If test engine 122 determines that the signal voltage of the second signal reaches or exceeds the threshold voltage within the signal propagation time determined for the first signal (decision 708, "YES" branch), test engine 122 determines that the test path of semiconductor device 100 does not contain a defect. If test engine 122 determines that the signal voltage of the second signal does not reach or exceed the threshold voltage within the signal propagation time determined for the first signal (decision 708, "NO" branch), test engine 122 records that a defect exists in the test path (step 710).

The steps illustrated in FIGS. 6 and 7 can be repeated for the other test paths of semiconductor device 100. If test engine 122 detects defects in multiple test paths, test engine 122 can identify the TSVs in common between the defective test paths, if any, in order to identify specific defective TSVs by way of logical deduction.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed, which are within the scope of the invention as outlined by the appended claims.

What is claimed is:

1. A method for detecting defects in through silicon vias (TSVs) of a semiconductor device, comprising the steps of:
a test engine determining a threshold signal voltage of a semiconductor device;
the test engine determining a first expected signal propagation time for a signal travelling through a first test path of the semiconductor device;
the test engine transmitting a first signal through the first test path;
the test engine measuring a signal voltage and a signal propagation time of the first signal;
the test engine determining that the first test path contains a defect based on determining that the signal voltage of the first signal does not reach or exceed the threshold signal voltage within the first expected signal propagation time, wherein the first expected signal propagation time is an expected time period for the propagation of the first signal through the first path, and wherein the first expected signal propagation time is determined based on analyzing simulation data detailing signal propagation time information corresponding to the first test path.

2. The method of claim 1, further comprising the steps of:
the computer determining a second expected signal propagation time for a signal travelling through a second test path;
the computer transmitting a second signal through the second test path;
the computer measuring a signal voltage and a signal propagation time of the second signal;
the computer determining that the signal voltage of the second signal does not reach or exceed the threshold signal voltage within the second expected signal propagation time; and
the computer determining that the second test path contains a defect.

3. The method of claim 2, further comprising the step of the computer determining that a first TSV is present in the first and second test path.

4. The method of claim 2, wherein the second expected signal propagation time includes an additional period of time added in to account for error.

5. The method of claim 1, wherein the first expected signal propagation time includes an additional period of time added in to account for error.

6. The method of claim 1, wherein the signal voltage and the signal propagation time of the first signal is measured during a testing time which is prior to the time when the TSVs are operational.

7. The method of claim 1, wherein the signal voltage and the signal propagation time of the first signal is measured at a time after testing time when the TSVs are operational.

8. A method for detecting defects in through silicon vias (TSVs) of a semiconductor device, comprising the steps of:
a computer determining a threshold signal voltage for a semiconductor device;
the computer determining a first expected signal propagation time for a signal travelling through a first test path of the semiconductor device;
the computer transmitting a first signal through the first test path at time one;
the computer determining a signal voltage and a signal propagation time of the first signal;
the computer determining that the first test path does not contain a defect at time one based on determining that the signal voltage of the first signal reaches or exceeds the threshold signal voltage within the first expected signal propagation time, wherein the first expected signal propagation time is an expected time period for the propagation of the first signal through the first path, and wherein the first expected signal propagation time is determined based on analyzing simulation data detailing signal propagation time information corresponding to the first test path.

9. The method of claim 8, further comprising the steps of:
the computer transmitting a second signal through the first test path at time two, wherein time two is a period of time after time one;
the computer determining a signal voltage and a signal propagation time of the second signal;
the computer determining that the signal voltage of the second signal does not reach or exceed the threshold signal voltage within the signal propagation time of the first signal; and
the computer determining that the first test path contains a defect at time two.

10. The method of claim 9, further comprising:
the computer determining a second expected signal propagation time for a signal travelling through a second test path of the semiconductor device;
the computer transmitting a third signal through the second test path at time one;
the computer determining a signal voltage and a signal propagation time of the third signal;
the computer determining that the signal voltage of the third signal reaches or exceeds the threshold signal voltage within the second expected signal propagation time; and
the computer determining that the second test path does not contain a defect at time one.

11. The method of claim 10, further comprising the steps of:
the computer transmitting a fourth signal through the second test path at time two, wherein time two is a period of time after time one;
the computer determining a signal voltage and a signal propagation time of the fourth signal;
the computer determining that the signal voltage of the fourth signal does not reach or exceed the threshold signal voltage within the signal propagation time of the third signal; and
the computer determining that the second test path contains a defect at time two.

12. The method of claim 11, further comprising the step of the computer determining that a first TSV is present in the first and second test path.

13. The method of claim 10, wherein the second expected signal propagation time includes an additional period of time added in to account for error.

14. The method of claim 8, wherein the first expected signal propagation time includes an additional period of time added in to account for error.

15. A semiconductor device for detecting defects in through silicon vias (TSVs), comprising:
a plurality of semiconductor dies connected by at least one transmit TSV and at least one receive TSV, wherein at least one of the plurality of semiconductor dies includes: (i) one or more multiplexers for looping a signal from the at least one transmit TSV to the at least one receive TSV; (ii) one or more edge detectors for measuring signal voltage; (iii) one or more delay monitors for measuring signal propagation time; and (iv) one or more test engines, wherein the one or more test engines coordinate all operations of the one or more multiplexers, edge detectors, and delay monitors, and determine if a signal voltage of a signal reaches or exceeds a threshold signal voltage within an expected signal propagation time, wherein the expected signal propagation time is an expected time period for the propagation of a signal through a path, and wherein the expected signal propagation time is determined based on analyzing simulation data detailing signal propagation time information corresponding to the first test path.

16. The semiconductor device of claim 15, further comprising at least one buffer for transmitting a signal to a transmit or receive TSV or receiving a signal from a transmit or receive TSV.

17. The semiconductor device of claim 15, further comprising a memory device for recording signal and defect information.

18. The semiconductor device of claim 17, wherein signal information includes signal voltage and signal propagation time.

19. The semiconductor device of claim 15, further comprising a timer.

* * * * *